United States Patent [19]

Ogawa

[11] Patent Number: 5,627,625
[45] Date of Patent: May 6, 1997

[54] PATTERN PROJECTING METHOD

[75] Inventor: Tohru Ogawa, Kanagawa, Japan

[73] Assignee: Sony Corporation, Tokyo, Japan

[21] Appl. No.: 327,054

[22] Filed: Oct. 21, 1994

[30] Foreign Application Priority Data

Oct. 27, 1993 [JP] Japan ................................ 5-268904

[51] Int. Cl.$^6$ ................................................. H01L 21/027
[52] U.S. Cl. ........................... 355/53; 355/67; 355/77
[58] Field of Search ........................... 355/53, 67, 77, 355/71; 359/639, 640

[56] References Cited

U.S. PATENT DOCUMENTS 5,363,170  11/1994  Muraki ..................................... 355/67

FOREIGN PATENT DOCUMENTS

| 0526242A1 | 2/1993 | European Pat. Off. . |
| 0576297 | 12/1993 | European Pat. Off. . |
| 0651291 | 5/1995 | European Pat. Off. . |
| 0698824 | 2/1996 | European Pat. Off. . |
| 4303028 | 8/1993 | Germany . |
| 4-267515 | 9/1992 | Japan . |

OTHER PUBLICATIONS

Patent Abstracts of Japan JP3 269 343, vol. 16, No.85, p. 1339, Feb. 28, 1992.

*Primary Examiner*—Joan H. Pendegrass
*Attorney, Agent, or Firm*—Hill, Steadman & Simpson

[57] ABSTRACT

A pattern projecting method is disclosed. The pattern projecting method has the step of illuminating a mask having a fine pattern formed therein with an exposure light and causing a transmitted light of the mask to be incident on a pupil of a projection optical system to project an image of the fine pattern onto a substrate, the illuminating step using an effective light source capable of achieving such light intensity distribution as to provide a predetermined light intensity in a central region of the pupil, a maximum light intensity in plural peripheral regions around the central region, and a light intensity lower than the maximum light intensity in a region connecting the plural regions.

9 Claims, 7 Drawing Sheets

PATTERN PROJECTING METHOD

BACKGROUND OF THE INVENTION

1. Field of the Invention

This invention relates to a pattern projecting method adapted for projecting a fine circuit pattern of a semiconductor device onto a wafer, and particularly to the method for avoiding deterioration of depth of focus dependent upon the pattern and irregularity in illuminance.

2. Description of the Related Art

In manufacture of the semiconductor device, the 16 MDRAM based upon the design rule of half micron (0.5 μm) level has already been on a mass production line. In research on the semiconductor device, processing of sub-half micron (up to 0.35 μm) level required for the 64 MDRAM and quarter micron (0.25 μm) level required for the 256 MDRAM has been studied. An essential technique for such fine processing is photolithography. The resolution of an exposure device, particularly of a reduced projection exposure device (referred to as a stepper) used for photolithography, determines the possibility of research, development and mass production of the semiconductor device.

Conventionally, the resolution in photolithography has been improved by shortening the exposure wavelength and increasing the numerical aperture of a projection lens of the stepper. This improvement is apparent from the relation shown by the following Equation I, known as Rayleigh's formula:

$$R = k_1 \times \lambda / NA \qquad \text{Equation I}$$

wherein R denotes the resolution, $k_1$ the process coefficient, $\lambda$ the exposure wavelength, and NA the numerical aperture of the projection lens of the stepper.

In manufacturing the semiconductor device, the resolution (R) and the depth of focus (DOF) are also important parameters for the following reason. Since the wafer surface onto which a pattern is to be projected has irregularities generated therein by warping of the pattern or the wafer, the photoresist coating film cannot be exposed on the same single focal plane at every position in the wafer surface or in the same chip. The depth of focus (DOF) is expressed by the following Equation II:

$$DOF = k_2 \times \lambda / (NA)^2 \qquad \text{Equation II}$$

wherein $k_2$ denotes the process coefficient.

The depth of focus (DOF) of approximately 1.5 μm is preferred in the mass production.

From the above Equation II, it is found that the resolution (R) is limited up to about 0.35 μm to achieve the DOF of 1.5 μm using a KrF excimer laser beam with a wavelength λ=248 nm. Stated differently, the required resolution and depth of focus are in the relation of trade-off. It is therefore extremely difficult to resolve a line width finer than 0.35 μm while achieving the focal depth of not less than 1.5 μm.

Thus, it has been attempted recently to eliminate the above difficulty by improving the optical system of the stepper. For improving the optical system, a known technique is used in which darkening the center of an effective light source plane or a pupil plane conjugate thereto of the projection lens causes a super-resolution phenomenon, which improves the contrast of an image. This technique is effective in a partly coherent image-forming system such as the stepper.

One technique to generate the super-resolution phenomenon is an oblique illumination method, or a modified illumination method. In this method, a filter is mounted on a fly eye lens located between an exposure light source and a mask in the stepper optical system, so that the mask is obliquely illuminated.

In the oblique illumination method, the exposure light is incident on the mask obliquely and away from the optical axis. The incident light is divided into a 0-dimensional diffracted light which has not been diffracted by a Cr pattern on the mask and has advanced straight, a ±1-dimensional diffracted light diffracted by the Cr pattern, and a ±n-dimensional diffracted light of higher dimension. When the exposure light is radiated onto the mask from such an angle that the 0-dimensional diffracted light passes the outer periphery of the incidence pupil, light components on one side of a diffracted light symmetrically generated around the 0-dimensional diffracted light are incident on the reduced projection lens. With the conventional method, since the 0-dimensional diffracted light is incident vertically in the direction of optical axis, only the diffracted light with a diffraction angle of up to α can be incident on the reduced projection lens. On the contrary, with the oblique illumination method, the diffracted light with a diffraction angle of up to about 2α, though on one side of the 0-dimensional diffracted light, can be incident on the reduced projection lens. Thus, the pitch of interference fringe is diminished, so that the critical resolution can be improved.

Meanwhile, in the conventional exposure method for vertically illuminating the mask, deviation of the wafer along the optical axis from the focal plane, that is, de-focusing, causes an optical path difference in the ±1-dimensional light, thereby limiting the depth of focus. In the oblique illumination method, however, if the angle of oblique illumination, that is, the angle of incidence of the 0-dimensional diffracted light, is optimized in response to the pitch of the Cr pattern, angles made by the center line of the reduced projection lens with the 0-dimensional light and the +1-dimensional light, respectively, can be made equal. Thus, the optical path difference can be eliminated. Since the 0-dimensional light and the +1-dimensional light can interfere constantly with the same phase on the wafer, the depth of focus increases, and a satisfactory image-forming status can be maintained even in the case of de-focusing.

However, an illuminating light incident in the direction along the longitudinal direction of a cyclic pattern does not improve the resolution to the cyclic pattern. Thus, to reduce the dependency upon the pattern direction, the effective light source is formed in a circular zone shape, or divided into two parts (left and right parts) or into four parts (upper left and right, and lower left and right parts).

The division into four parts improves the resolution by cutting the vertical incident light on lines and spaces in a particular direction. For instance, a method of controlling the shape of the effective light source using a four-hole filter 10 having a total of four circular apertures 2 located in the first to fourth quadrants of a disc 1, respectively, as shown in FIG. 1, is disclosed in the JP Patent Laid-Open (KOKAI) Publication No.4-267515.

As described above, the oblique illumination method is notable for being capable of improving the critical resolution and the depth of focus in comparison to the conventional method, though using the conventional reticle. However, it also has problems to be solved for practical use.

Since the filter mounted on the fly eye lens filters a light, the illuminance on the wafer surface is lowered. This lowering of illuminance may cause generation of a dimensional change difference within the wafer surface or a severe reduction in throughput when a chemical amplification resist material is used in excimer laser lithography, in which a highly sensitive photoresist has not yet been developed.

The fly eye lens is originally an optical part for transmitting a light from a single exposure light source through a large number of unit lenses thereof to virtually transform the single exposure light source into a large number of point light sources so as to eliminate the irregularity in illuminance on the mask through integration of lights transmitted through the individual unit lenses. Consequently, if the filter is mounted on the fly eye lens, the number of unit lenses serving to eliminate the irregularity in illuminance is reduced, and the irregularity necessarily increases. In addition, the small aperture of the filter increases proximity effect.

Further, the oblique illumination method is ineffective for an isolated pattern such as an end pattern of repetition patterns or a contact hole, while it is effective for repetition patterns of line and space forming an image through interference. Therefore, in anticipation of dimensional changes, it is necessary to modify the pattern to be larger or smaller at the time of designing the mask. However, in producing the device employing the design rule of not more than 0.35 µm, the modification is extremely small in scale and actually imposes a great amount of burden onto the mask designing and production.

OBJECT AND SUMMARY OF THE INVENTION

It is therefore an object of the present invention to provide a pattern projecting method which is capable of reducing proximity effect and deterioration and irregularity in illuminance without imposing burdens to mask designing, and which is also capable of eliminating dependency of the depth of focus upon the pattern.

According to the present invention, there is provided a pattern projecting method having the step of illuminating a mask having a fine pattern formed therein with an exposure light and causing a transmitted light of the mask to be incident on a pupil of a projection optical system to project an image of the fine pattern onto a substrate. The illuminating step uses an effective light source capable of achieving such light intensity distribution as to provide a predetermined light intensity in a central region of the pupil, a maximum light intensity in plural peripheral regions around the central region, and a light intensity lower than the maximum light intensity in a region connecting the plural regions.

In further detail, to achieve the above light intensity distribution, a method of dividing the exposure light into unit beams of the same number as that of regions having the maximum light intensity and superposing edges of adjacent unit beams is employed. At this point, if at least one of the dimension of a shorter side of the unit beam and the amount of superposition of the unit beams is changed, the light intensity distribution can be changed. It is particularly preferred to control the predetermined light intensity in the central region within a range of 20 to 50% of the maximum light intensity.

To evenly irradiate every region of the mask surface, it is preferred to provide the plural regions having the maximum light intensity in rotation symmetry to the central region of the pupil.

The number of the unit beams is typically set to 4.

The light intensity distribution of the effective light source used in the pattern projecting method of the present invention differs most from that of the conventional oblique illumination method in that the central region has the predetermined light intensity while the plural regions having the maximum light intensity are provided in the peripheral regions. Stated differently, the depth of focus for a repetition pattern can be increased to a degree equivalent to or higher than that of the conventional oblique illumination method, depending upon the exposure light provided from the region having the maximum light intensity. Also, deterioration of the depth of focus can be avoided in an end pattern of an isolated pattern or the repetition pattern, depending upon the exposure light provided from the central region having the predetermined light intensity. Thus, the dependency of the depth of focus upon the pattern can be reduced.

Since a shielding filter is not used, the number of unit lenses of the fly eye lens serving for illumination is not reduced. Consequently, lowering and non-uniformity of illuminance or proximity effect can be significantly restricted.

When the above-described light intensity distribution is achieved by superposing the edges of the plural unit beams formed by dividing the exposure light, the plural regions having the maximum light intensity are formed in a superposed portion of two unit beams, and the region connecting the plural regions is formed in the vicinity of the center of each unit beam. The predetermined light intensity in the central region is achieved by synthesizing the amount of leaky lights from the unit beams.

Consequently, if at least one of the dimension of the shorter side of the unit beam and the amount of superposition is changed, the area ratio of each region changes, so that the light intensity distribution of the effective light source can be changed.

An excessively high light intensity in the central region increases the vertical incident component of the 0-dimensional light, causing deterioration of the resolution and the depth of focus. Thus, the illumination in this projection is more like normal illumination. On the contrary, an excessively low light intensity causes the illumination to be more like the conventional oblique illumination, in which deterioration of and an increase in irregularity in illuminance and an increase in proximity effect may be caused. The light intensity in the central region described in the present invention is in the optimum range found by simulation. In this optimum range, satisfactory resolution which is less dependent upon the pattern can be achieved.

Meanwhile, since the resist coating film is exposed to light with the optical axis inclined in the oblique illumination method, the illumination in one direction causes the image to be in a position deviated in the direction of depth. However, by providing the regions having the maximum light intensity in rotation symmetry to the central region, the deviation can be corrected. When, with the number of unit beams being set to 4, the regions having the maximum light intensity are provided in positions covering vertices of a square, an image is synthesized by lights in four directions so as to form a vertical pattern.

BRIEF DESCRIPTION OF THE DRAWINGS

FIG. 4A is a two-dimensional map thereof. FIG. 4B is a three-dimensional map thereof.

DETAILED DESCRIPTION OF THE PREFERRED EMBODIMENTS

Preferred embodiments of the present invention will now be described in detail with reference to the accompanying drawings.

A first embodiment of the present invention is described hereinbelow.

In the present embodiment, a KrF excimer laser beam is divided into four rectangular unit beams by a beam splitter. The four unit beams are re-superposed to form an effective light source capable of achieving an intensity of 30 to 50% of the maximum light intensity in the central region of a pupil. By using the resulting effective light source, a pattern of line and space 0.35 µm in width is projected. Then, resolution in this case is studied.

Figure 2:
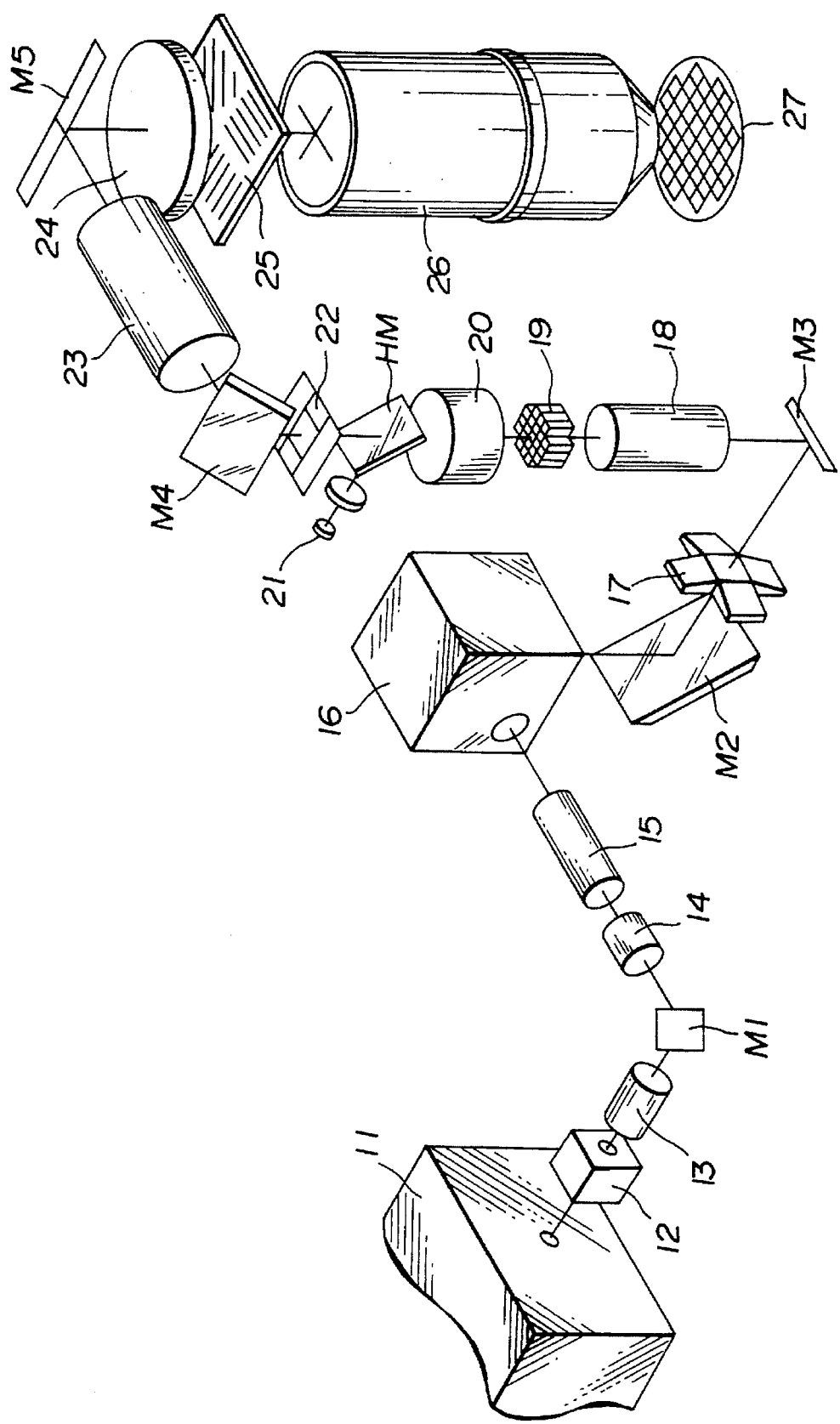
FIG. 2 is a perspective view showing an optical system of a KrF excimer laser stepper.

First, an optical system of a KrF excimer laser stepper used in the present embodiment is described with reference to FIG. 2.

The optical system leads a laser beam emitted from a KrF excimer laser unit 11 through an output control device 12, a beam shaping optical system 13, a shift optical system 14 and a delivery optical system 15 to a beam splitter unit 16. The beam splitter unit 16 divides the laser beam into four unit beams B1 to B4 using a cylindrical lens, not shown. After the four unit beams B1 to B4 are re-superposed by a prism unit 17, the superposed laser beam is transmitted sequentially through a relay lens 18, a fly eye lens 19 for creating uniform illuminance, a relay lens 20, a half mirror HM for splitting a part of the superposed laser beam to an irradiation amount sensor 21, a masking blade 22, a relay lens 23 and a condenser lens 24 to illuminate a mask 25. The transmitted beam of the mask 25 is incident on the pupil of a reduced projection lens 26 so as to project a pattern onto a wafer 27. The optical path of the laser beam in this optical system is bent by mirrors M1 to M5 provided in preferred positions for reducing the size of the device.

In this optical system, the surface of the fly eye lens 19, that is, the effective light source plane, is conjugate to the reduced projection lens 26. The surface of the mask 25 is conjugate to the surface of the wafer 27. That is, a Fourier transform image on the mask surface is formed on the pupil plane, and the inversely transformed image thereof is formed on the wafer surface.

The operation of dividing the laser beam into four unit beams by the beam splitter unit 16 and re-superposing the divided beams by the prism unit 17 has been conventionally employed for preventing speckles. The re-superposing operation provides an optical path difference not smaller than the coherent distance, so as to reduce coherency of the laser beam. In the conventional operation, however, since the unit beams divided into four directions are superposed without having gaps between one another, the uniform light intensity distribution of the effective light source can be provided.

On the contrary, in the present invention, the particular light intensity distribution on the fly eye may be varied by controlling superposition of the divided unit beams. The superposing method is explained with reference to FIGS. 3A to 3C.

Figure 3A:
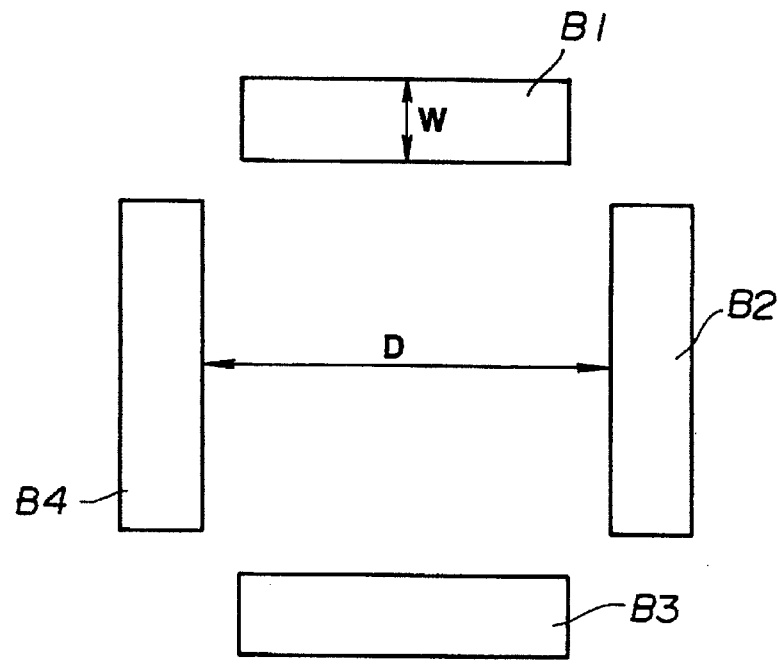
FIGS. 3A to 3C are plan views for explaining division of a laser beam and re-superposition of divided laser beams in the present invention.

FIG. 3A shows location of the four rectangular unit beams B1 to B4 formed by a cylindrical lens provided within the beam splitter unit 16. The dimension W of the shorter side of each beam can be changed in accordance with the curvature of the cylindrical lens. The distance D between the beams can be changed by controlling the position of the wedge-shaped prism unit 17 on the subsequent stage.

Figure 3B:
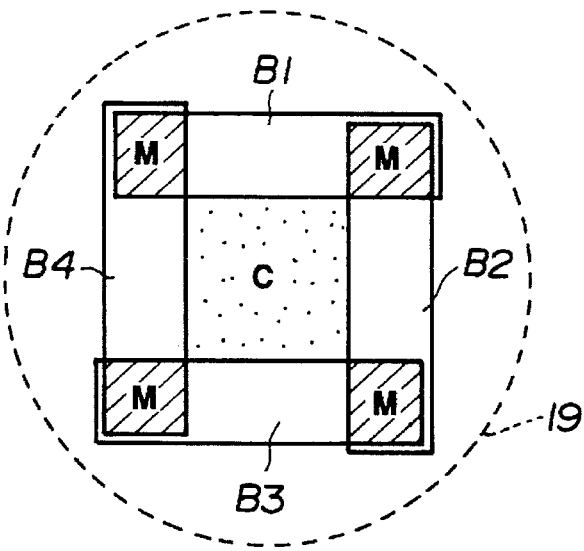

FIG. 3B shows a state in which the four unit beams B1 to B4 are superposed so that edges of the unit beams are superposed within the effective light source plane of the fly eye lens 19. In this state, maximum light intensity regions M in which two unit beams are superposed are provided at four corners of the square, and regions connecting the maximum light intensity regions M have a predetermined light intensity in response to the original light intensity of the unit beams B1 to B4 and the amount of superposition. In addition, as the characteristics of the light intensity distribution in the present invention, a predetermined light intensity lower than the maximum intensity due to light leaking from the unit beams B1 to B4 is provided in a central region C, which is not directly irradiated with the beam.

Figure 3C:
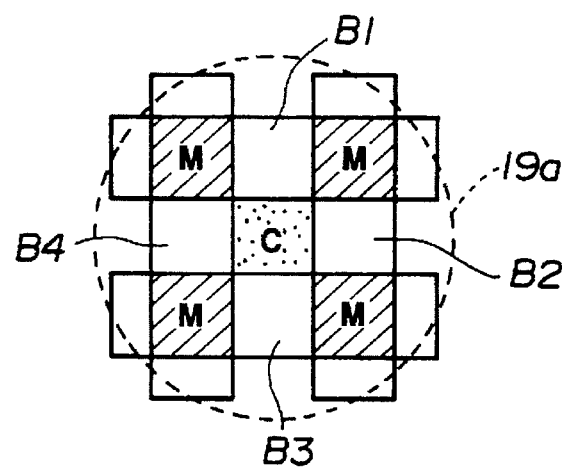

As a modification thereof, the unit beams B1 to B4 may be superposed with their edges slightly extruding, as shown in FIG. 3C. Thus, the area ratio of the maximum intensity regions M to the central region C covering the effective light source plane 19a can be suitably changed.

Figure 4A:
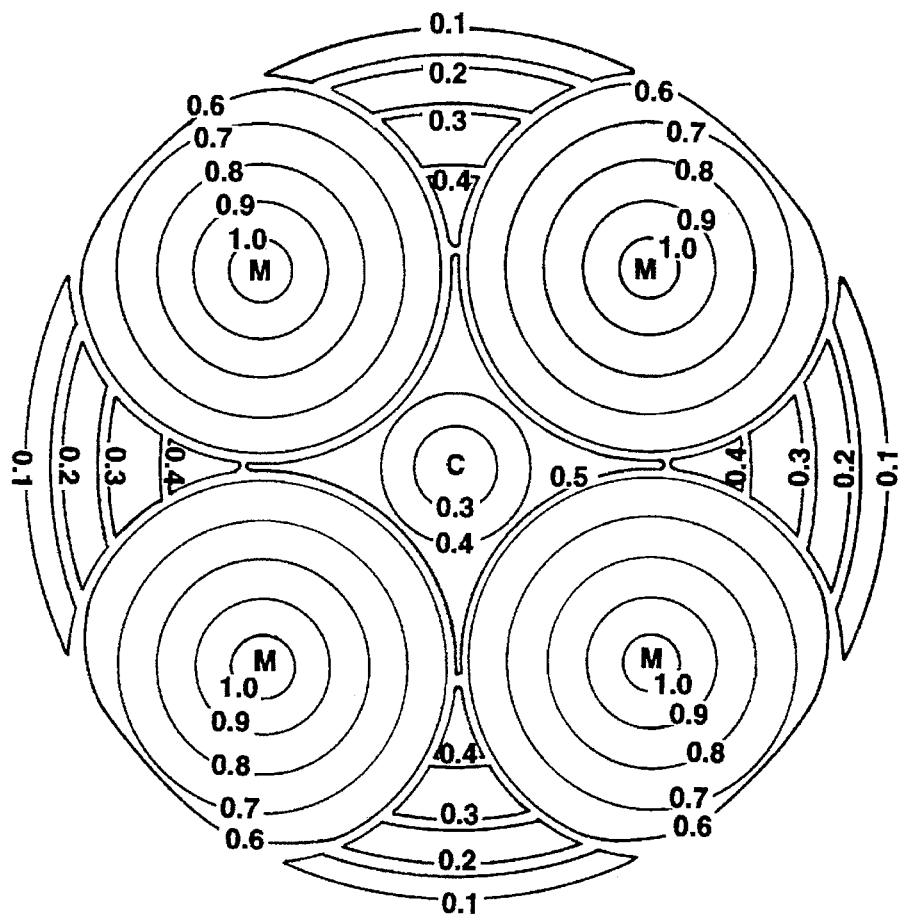
FIGS. 4A and 4B are views for explaining an example of light intensity distribution of an effective light source in the present invention.
Figure 4B:
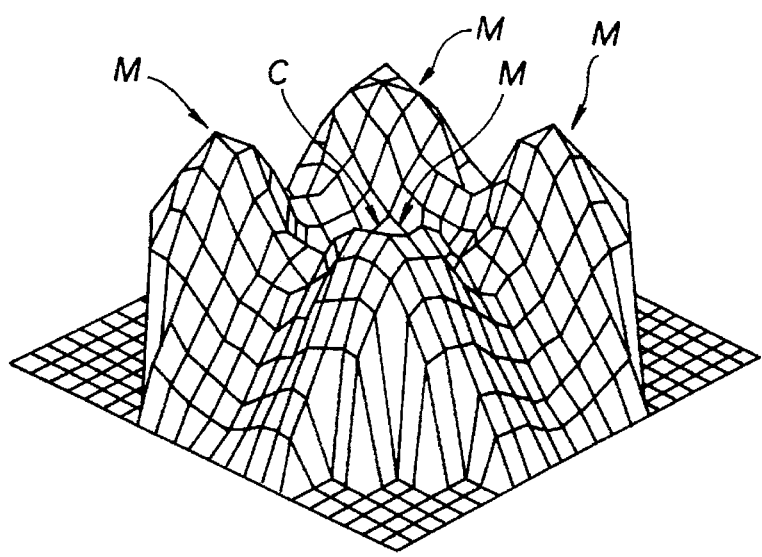

FIGS. 4A and 4B show an example in which the amount of beam superposition is optimized through simulation. FIG. 4A is a map in which portions having the same light intensity are grouped by lines. The numerical value attached to each line expresses the rate of light intensity with the maximum light intensity of the maximum light intensity region M being expressed by 1.0. FIG. 4B shows the above-described map in the three-dimensional manner.

Figure 1:
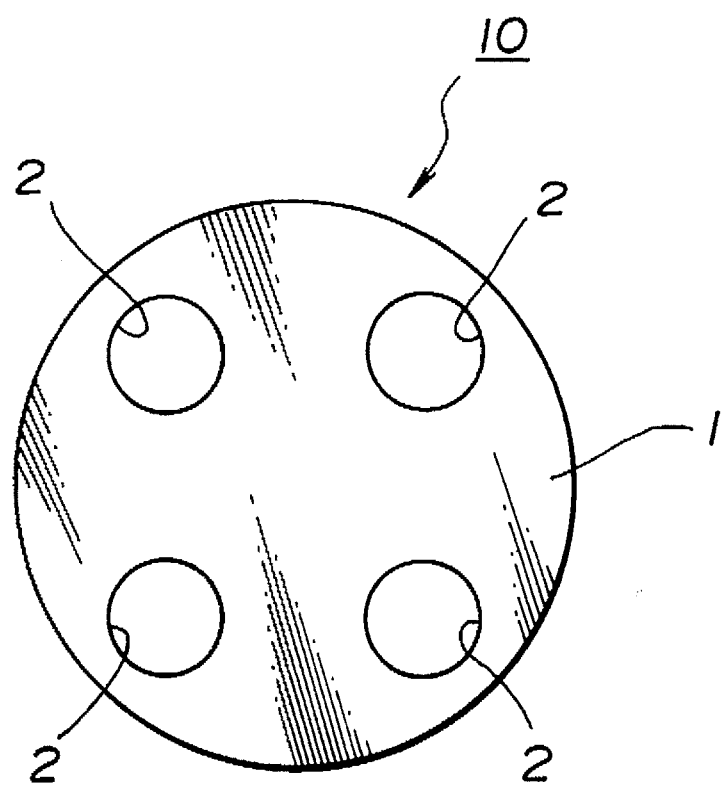
FIG. 1 is a plan view showing a four-hole filter used in conventional normal illumination.

Thus, FIGS. 4A and 4B indicate that the light intensity distribution of the effective light source proximate to that of a case in which the four-hole filter 10 as shown in FIG. 1 is used can be achieved, though such a filter is not used in the present invention.

By using the effective light source having the light intensity distribution shown in FIGS. 4A and 4B, a pattern of line and space 0.35 µm in width is projected, and the resolution in this case is studied.

The pattern used in this case has 5-bar chart in which 5 lines each having a width of 0.35 µm are arrayed, vertically and obliquely at an angle of ±45°, at intervals of 0.35 µm from one another, and isolated vertical and oblique patterns 0.35 µm in width.

The depth of focus of the center pattern of the vertical 5-bar chart, the depth of focus of the center and end patterns of the vertical and oblique 5-bar chart, the depth of focus of the vertical and oblique isolated patterns, and the common depth are studied. The common depth, which is the depth of focus common to all the patterns, represents a significant value in producing the actual device in which patterns having various shapes, densities and orientations are mixedly present.

The results are shown in Table 1, in which results of normal illumination, oblique illumination with a four-hole filter and zonal illumination are also shown for comparison.

TABLE 1

[unit: μm]

|  | Depth of Focus of Center Pattern of Vertical 5-Bar Chart | Depth of Focus of Center and End Patterns of Vertical and Oblique 5-Bar Chart | Depth of Focus of Vertical and Oblique Isolated Patterns | Common Depth |
| --- | --- | --- | --- | --- |
| Embodiment 1 | 2.25 | 1.80 | 1.35 | 1.35 |
| Normal Illumination | 1.35 | 1.30 | 0.98 | 0.98 |
| Oblique Illumination | 3.83 | 1.75 | 0.92 | 0.92 |
| Zonal Illumination | 2.20 | 1.80 | 1.16 | 1.13 |

The conventional illuminating methods are first studied. With the oblique illumination and the zonal illumination, the depth of focus of the center pattern of the 5-bar chart is much better than the depth of focus with the normal illumination. However, the oblique illumination and the zonal illumination are ineffective for improving the common depth including all the patterns because of the lower proximity effect and the lower effect for the isolated pattern.

On the contrary, in the present embodiment, improvement in the depth of focus of the 5-bar chart equal to or greater than the depth of focus with the zonal illumination can be achieved. In addition, since the improvement is observed also in the isolated pattern, the common depth is improved by approximately 38% in comparison to the common depth with the normal illumination. The reason therefor is that the central region of the effective light source also has a certain degree of light intensity.

Then, illuminance and irregularity in illuminance are studied. The results are shown in Table 2.

TABLE 2

|  | Illuminance [mW/cm²] * parenthesis represents values standardized with normal illumination | Irregularity in Illuminance [%] |
| --- | --- | --- |
| Embodiment 1 | 200 (0.91) | 1.5 |
| Normal Illumination | 220 (1.0) | 1.4 |
| Oblique Illumination | 62 (0.28) | 6.6 |
| Zonal Illumination | 64 (0.29) | 5.7 |

In Table 2, illuminance values standardized by using the values of normal illumination are also shown in parentheses. As shown in Table 2, the oblique illumination and the zonal illumination cause a reduction in illuminance by approximately 30% and deterioration of irregularity in illuminance by not less than 5%, in comparison to the normal illumination. Such irregularity in illuminance causes large irregularity in line width in view of the relatively low sensitivity of the present photoresist material.

On the contrary, in the present embodiment, the illuminance is lowered only by about 10% in comparison to the illuminance with the normal illumination, and the irregularity in illuminance is maintained at a level equivalent to that with the normal illumination.

A second embodiment of the present invention will now be described.

In the present embodiment, by using the effective light source shown in FIGS. 4A and 4B, an element separation pattern of an actual semiconductor device based upon the design rule of 0.28 μm is projected. The resolution in this case is studied.

Figure 5:
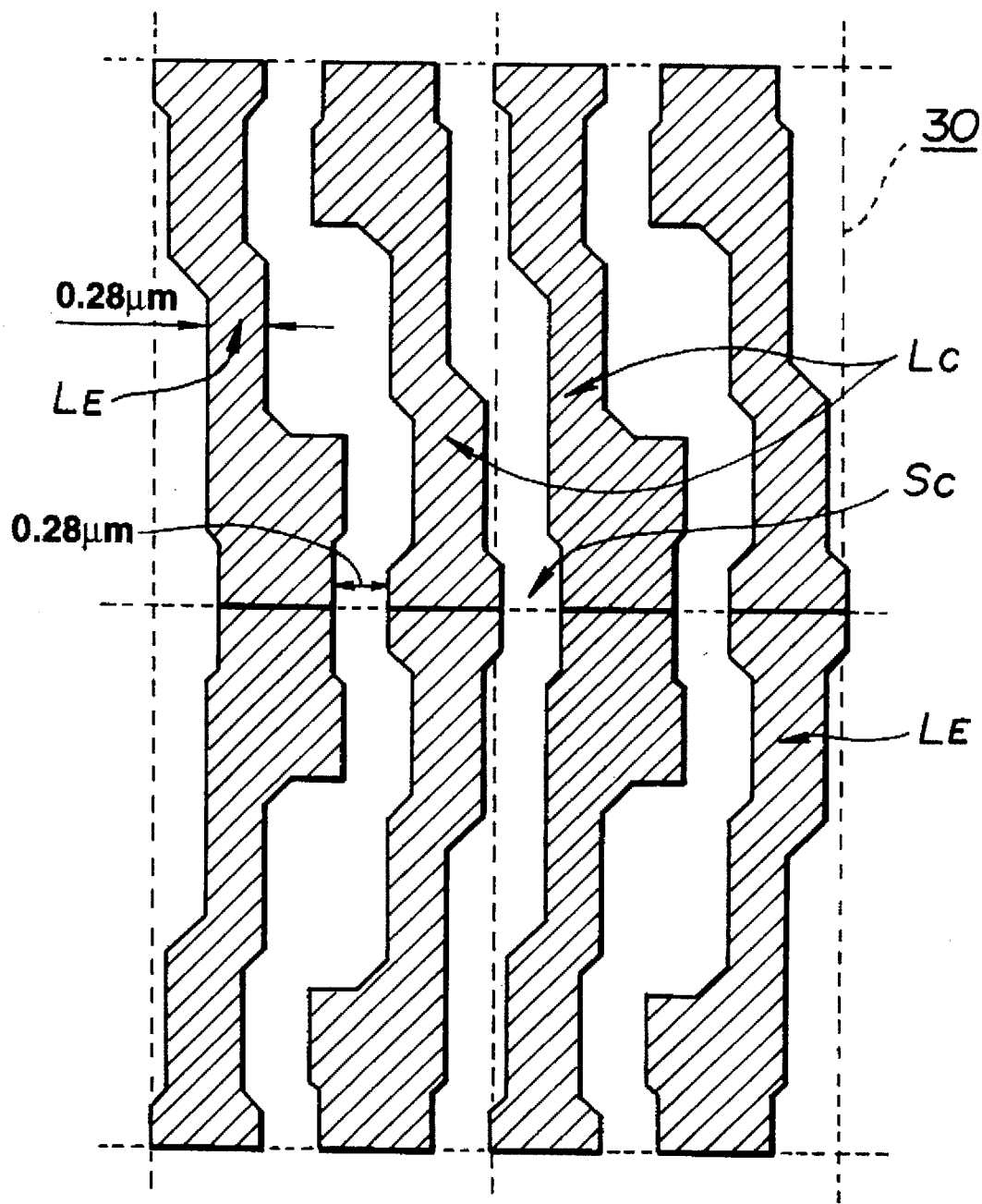
FIG. 5 is a plan view showing an element separation pattern on a mask used in an embodiment of the present invention.

FIG. 5 shows the element separation pattern. This element separation pattern is a pattern for defining an oxidation region in the LOCOS method within a memory cell 30 of SRAM. The shaded areas represent lines of Cr shielding films on a mask 25 corresponding to the element separation region, while the white (light transmitting) areas represent spaces.

Figure 6:
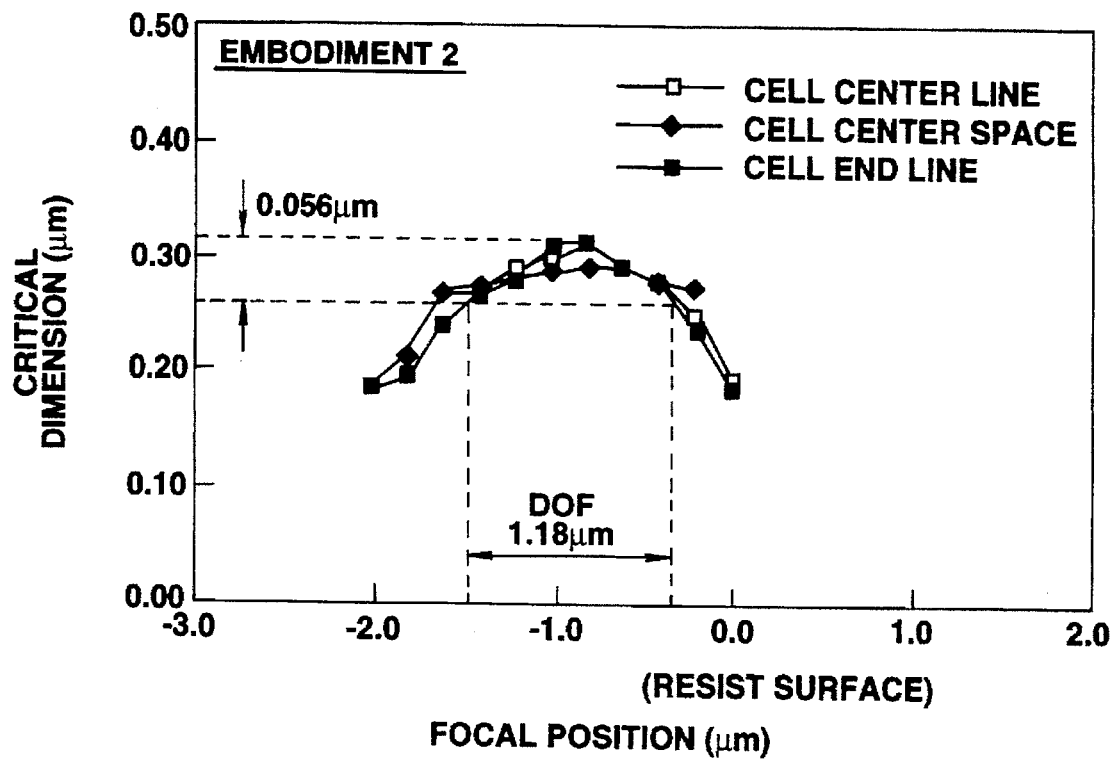
FIG. 6 is a graph showing resolution in a case where the element separation pattern of FIG. 5 is projected using the present invention.

To find the effect of the proximity effect due to density of the pattern, a cell center line $L_C$, a cell center space $S_C$ and a cell end line $L_E$ are noted, and changes in critical dimension in a case where the focal position is changed are measured. The results are shown in FIG. 6. In this case, an allowable range of changes in critical dimension are defined to have a maximum value of the line width on the photoresist surface as the upper limit and to have a value reduced by 0.056 μm corresponding to ±10% of the design rule of 0.28 μm as the lower limit. The range of focal position (that is, the depth from the resist surface) capable of achieving the allowable range is found as the depth of focus DOF.

Figure 8:
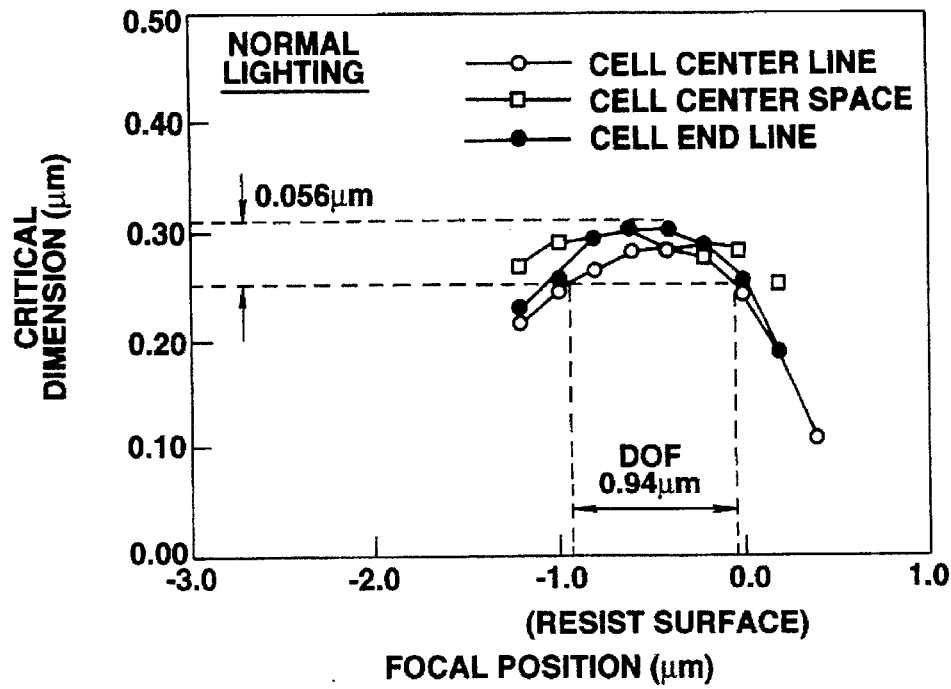
FIG. 8 is a graph showing resolution in a case where the element separation pattern of FIG. 5 is projected by normal illumination.
Figure 9:
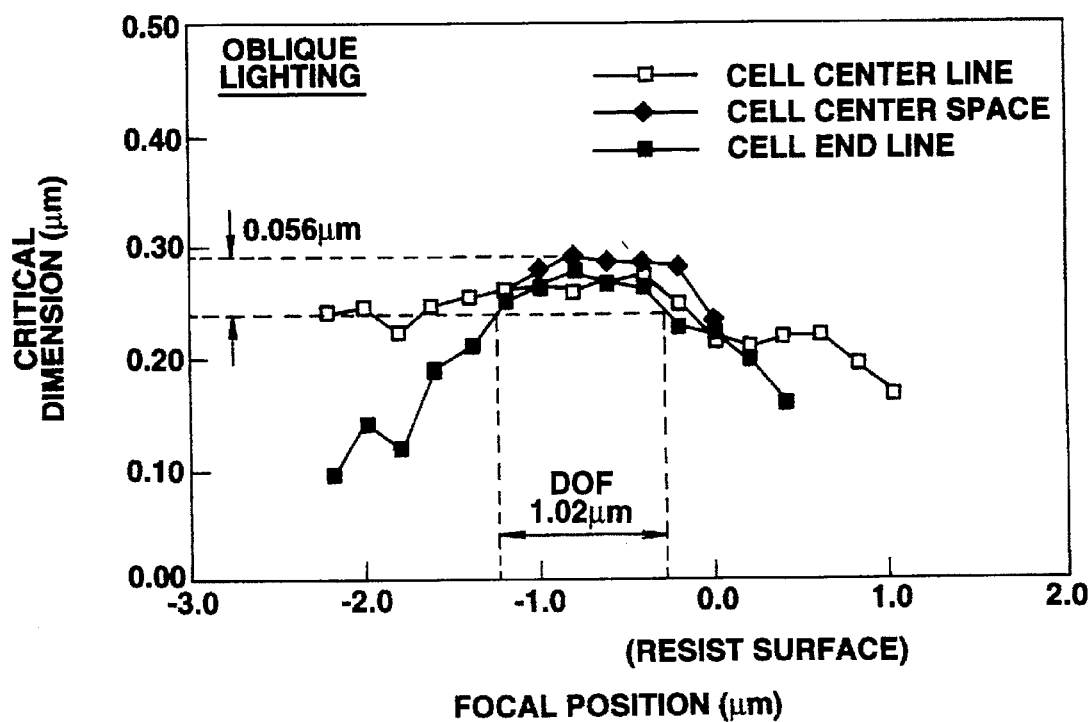
FIG. 9 is a graph showing resolution in a case where the element separation pattern of FIG. 5 is projected by oblique illumination using a four-hole filter.

In comparison, the measurement results with the normal illumination and those with the oblique illumination using a four-hole filter are shown in FIGS. 8 and 9, respectively.

The depth of focus DOF in the present embodiment is 1.18 μm, and the DOF with the normal illumination is 0.94 μm while the DOF with the oblique illumination is 1.02 μm. In short, the depth of focus DOF in the present embodiment is improved by about 26% in comparison to the case of the normal illumination.

A third embodiment of the present invention will now be described.

In the present embodiment, by using the effective light source as shown in FIGS. 4A and 4B, a circuit pattern of an actual semiconductor device based upon the design rule of 0.28 μm is projected. The resolution in this case is studied.

Figure 7:
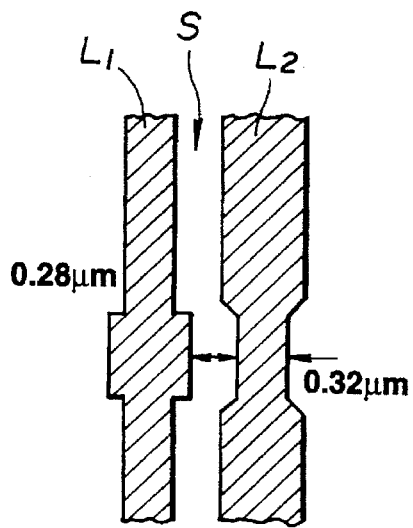
FIG. 7 is a plan view showing a circuit pattern on a mask used in another embodiment of the present invention.

FIG. 7 shows the circuit pattern. The shaded areas represent lines $L_1$, $L_2$ of Cr shielding films on the mask 15 corresponding to the circuit pattern, and the white (light transmitting) area represents a space. Using this circuit pattern, measurement similar to that of the second embodiment is conducted. In comparison, the measurement with the normal illumination and the oblique illumination using the four-hole filter is also conducted.

The depth of focus DOF in the present embodiment is 1.50 μm, and the DOF with the normal illumination is 0.90 μm while the DOF with the oblique illumination is 1.15 μm. In short, the depth of focus in the present embodiment is improved by about 60% in comparison to that with the normal illumination. The resulting depth of focus is at a level satisfactory for mass production.

The present invention is described on the basis of the above three embodiments. However, it is to be understood that the present invention is not limited to these embodiments, and that the number and shape of maximum light intensity regions, the type and design rules of the projection pattern, or numerical values of light intensity and exposure wavelength may be suitably changed.

As is clear from the above description, in the present invention, the dependency of resolution upon the pattern, insufficient illuminance and irregularity in illuminance in the conventional oblique illumination can be improved. The improvement does not impose any burden on designing and production of the mask, and is extremely advantageous in costs.

Thus, the present invention largely contributes to manufacturing of the semiconductor device of large-scale integration and high performance designed on the basis of fine design rules.

What is claimed is:

1. A pattern projecting method comprising the steps of:
   illuminating a mask having a fine pattern formed therein with an exposure light; and
   transmitting a light of the mask to be incident on a pupil of a projection optical system to project an image of the fine pattern onto a substrate with a light intensity distribution having a maximum light intensity in plural peripheral regions around a central region of the pupil, a predetermined light intensity of 20 to 50% of the maximum light intensity in said central region, and a light intensity lower than the maximum light intensity in a region connecting the plural regions.

2. The pattern projecting method according to claim 1, wherein the illuminating step includes:
   dividing the exposure light into unit beams of the same number as the number of regions having the maximum light intensity and superposing edges of adjacent unit beams.

3. The pattern projecting method as claimed in claim 1, further comprising:
   controlling the light intensity distribution by changing a dimension of a shorter side of the unit beam.

4. The pattern projecting method as claimed in claim 1, wherein the predetermined light intensity in the central region of the pupil is controlled within a range of 20 to 50% of the maximum light intensity.

5. The pattern projecting method as claimed in claim 1, further comprising:
   locating the plural regions having the maximum light intensity in rotation symmetry to the central region of the pupil.

6. The pattern projecting method as claimed in claim 1 the dividing step includes dividing the exposure light into four unit beams.

7. The pattern projecting method as claimed in claim 1, further comprising:
   controlling the light intensity distribution by changing an amount of superposition of the unit beams.

8. The pattern projecting method as claimed in claim 2, further comprising:
   controlling the light intensity distribution by changing an dimension of a shorter side of the unit beam.

9. The pattern projecting method as claimed in claim 2, further comprising:
   controlling the light intensity distribution by changing an amount of superposition of the unit beams.

* * * * *